United States Patent [19]

Kachidurian

[11] 4,095,861

[45] Jun. 20, 1978

[54] DUST-PROOF CART

[75] Inventor: Adam Kachidurian, Newton, N.J.

[73] Assignee: Burroughs Corporation, Detroit, Mich.

[21] Appl. No.: 832,118

[22] Filed: Sep. 12, 1977

[51] Int. Cl.² .................................................. A47B 97/00
[52] U.S. Cl. .................................. 312/250; 312/138 R; 312/321; 312/324; 312/326; 312/350; 312/351; 361/415
[58] Field of Search ................... 312/211, 138 A, 250, 312/330, 236, 311, 199, 350, 351, 138 R, 321, 324, 326; 325/353, 355, 352; 361/415; 211/41

[56] References Cited

U.S. PATENT DOCUMENTS

| 1,901,509 | 3/1933 | Hall | 312/236 |
| 2,845,780 | 8/1958 | Conklin et al. | 312/236 |
| 3,188,524 | 6/1965 | Williams | 361/415 |
| 3,321,258 | 5/1967 | MacKay | 312/250 |

Primary Examiner—Paul R. Gilliam
Assistant Examiner—A. Grosz
Attorney, Agent, or Firm—Kevin R. Peterson; Robert A. Green; Edward J. Feeney, Jr.

[57] ABSTRACT

The cart comprises a housing containing a plurality of supports for slidable shelves and a plurality of horizontal louvers hinged to completely cover the spaces between adjacent shelves. Dust-proof seals are provided between adjacent louvers. A pair of vertical L-shaped brackets are hinged to the housing adjacent to the louvers, and the arrangement is such that the L-shaped brackets can be pivoted away from the louvers, and the louvers, when raised, can engage slots in at least one of the brackets which thus hold the louvers in the open position.

2 Claims, 3 Drawing Figures

Fig. 2
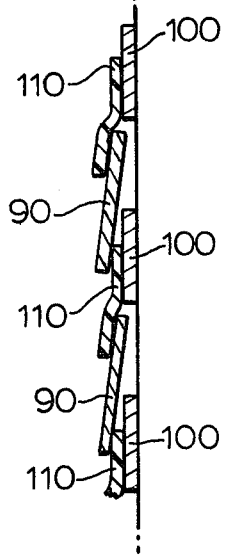
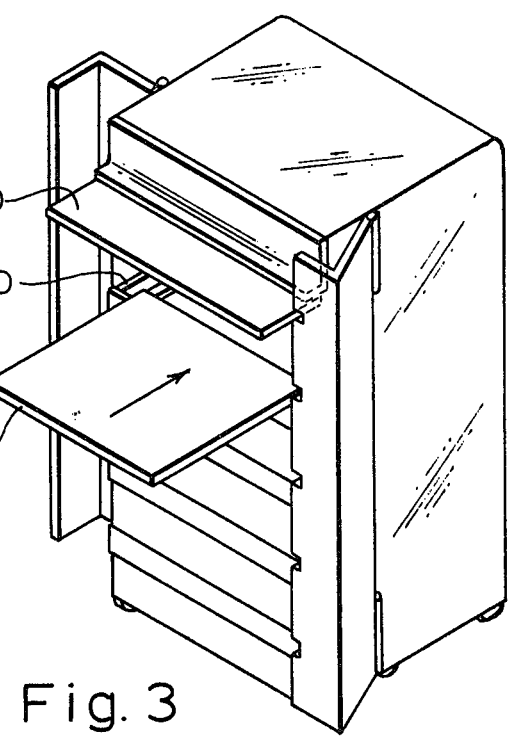
Fig. 3

DUST-PROOF CART

BACKGROUND OF THE INVENTION

In the electronics industry, many types of devices such as semiconductor devices and display panels are processed in steps, and, between steps, the devices or their subassemblies are moved from place to place. When such devices are moved about, it is desirable that they be carried or transported in a dust-proof carrier.

The prior art provides no suitable carrier of this type.

DESCRIPTION OF THE DRAWINGS

FIG. 2 is a sectional view of a portion of the cart of FIG. 1; and

FIG. 3 is a view similar to that of FIG. 1 illustrating the operation of the invention.

DESCRIPTION OF THE PREFERRED EMBODIMENTS

Figure 1:
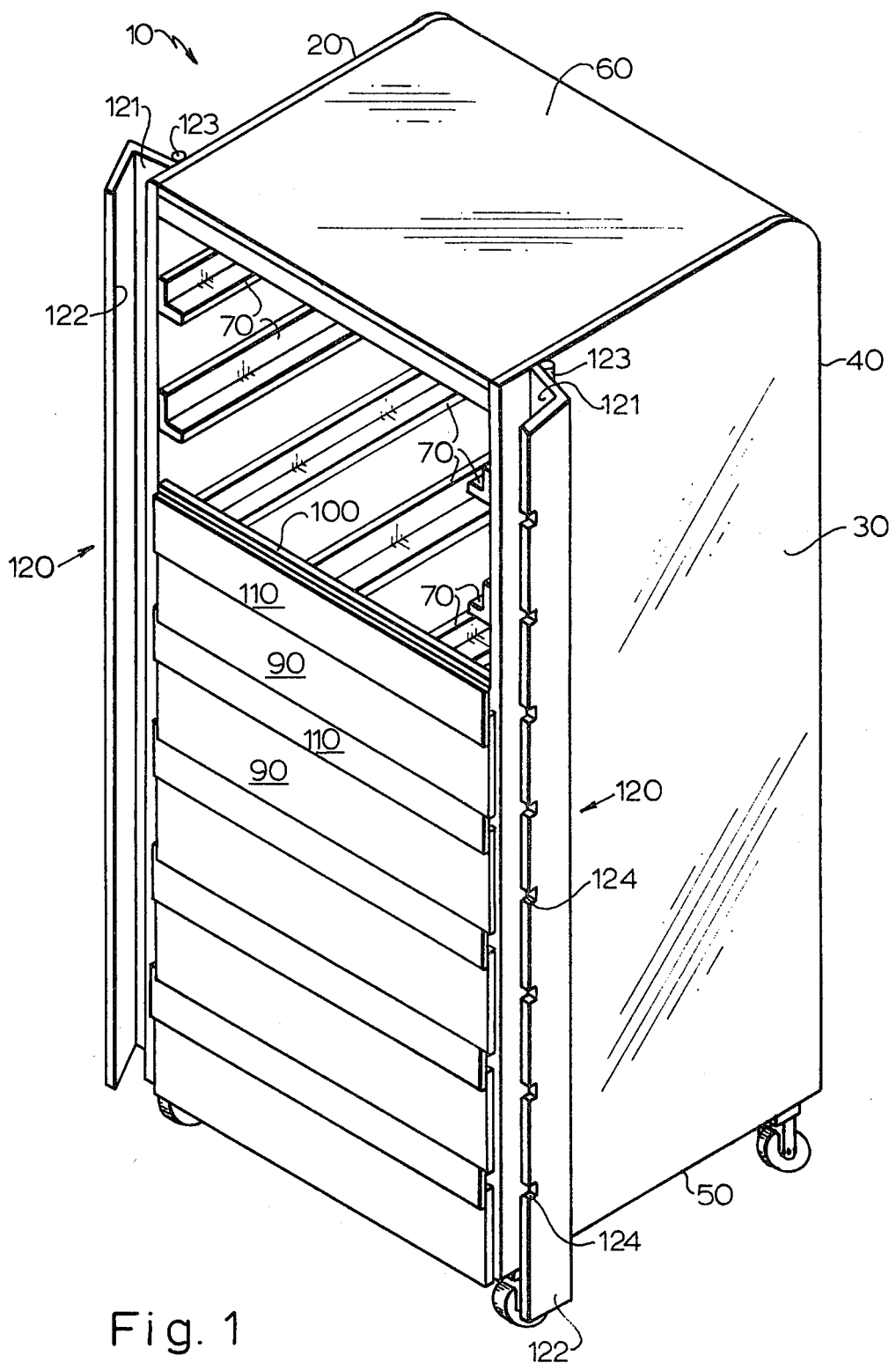
FIG. 1 is a perspective view of a cart embodying the invention.

A dust-proof cart 10 embodying the invention comprises a housing having solid side walls 20 and 30, rear wall 40, bottom wall 50, and top wall 60. The inner surfaces of the side walls are provided with a plurality of spaced-apart L-shaped brackets 70 which serve as shelves to removably support trays 80 which can carry articles to be transported on the cart.

A plurality of louvers 90 are suitably hinged to the housing so that they can be raised or lowered to expose or cover the shelf-receiving openings of the cart. Each louver is aligned with one shelf-receiving opening, and normally the louvers lie flat so that they combine to form a closure for the open front of the cart. The louver-support arrangement includes a plurality of horizontal metal plates 100 secured to the front edges of the side walls and extending across the front of the cart. Each louver is secured to a plate 100 by means of a length of tape 110. To improve the dust-proof closure of each louver, the lower portion of each louver seats on the strip of tape immediately beneath it (FIG. 2). The side edges of the louvers overlie the front edges of the side walls so that an essentially dust-proof closure is formed thereby. With this arrangement, the interior of the cart is substantially isolated from the surrounding atmosphere as far as dust or the like is concerned.

A pair of vertically elongated L-shaped brackets 120, havibng walls 121 and 122, are secured by hinges 123 to the outer surfaces of the side walls near the front wall of the cart. The brackets are dimensioned so that, when closed, as in FIG. 3, the brackets engage the front corners of the cart, with wall 121 in contact with the side wall, and wall 122 engaging a portion of the end of each of the louvers. The louvers are thus held closed. The brackets can pivot away to free the louvers so they can be raised. The brackets 120 extend along the cart from top to bottom. One of the L-shaped brackets is provided with notches 124 along the leading edge of the wall 122 so that, when it is desired to insert or remove one of the trays, the L-shaped brackets are pivoted away, as in FIG. 3, the appropriate louver is raised, the notched bracket is pivoted back, and the end of the louver is seated in the adjacent notch 124 to hold it raised. The tray can now be removed.

What is claimed is:

1. A dust-proof cart comprising
    a housing having solid bottom, top, side and rear walls but having an open front wall,
    means inside said housing for removably supporting trays,
    a dust-proof closure for the open front of said cart,
    said closure comprising a plurality of spaced-apart, horizontally extending louvers, and
    a pair of pivotable brackets secured to said side walls adjacent to said open front end and adapted to close over and hold said louvers in place, one of said brackets having a series of notches adapted to be engaged by a louver when the louver is in the raised position to expose the inside of said cart.

2. The apparatus defined in claim 1 wherein said closure includes
    a plurality of horizontally extending metal plates secured across said front wall,
    said louvers are secured, each to one of said plates by means of a strip of tape,
    the lower edge of each louver resting on the strip of tape associated with the louver beneath it to provide a generally dust-free seal.

* * * * *